(12) United States Patent
Chen et al.

(10) Patent No.: US 6,852,584 B1
(45) Date of Patent: Feb. 8, 2005

(54) METHOD OF TRIMMING A GATE ELECTRODE STRUCTURE

(75) Inventors: Lee Chen, Austin, TX (US); Hongyu Yue, Austin, TX (US); Hiromitsu Kambara, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/756,759

(22) Filed: Jan. 14, 2004

(51) Int. Cl.$^7$ ............................................. H01L 21/336
(52) U.S. Cl. ..................................... 438/197; 438/267
(58) Field of Search ......................................... 438/197

(56) References Cited

U.S. PATENT DOCUMENTS 5,910,912 A  *  6/1999  Hsu et al. .............. 365/185.01
6,794,279 B1  *  9/2004  Stephen et al. ............. 438/585

* cited by examiner

Primary Examiner—David Nelms
Assistant Examiner—Thao P. Le
(74) Attorney, Agent, or Firm—Pillsbury Winthrop LLP

(57) ABSTRACT

A method and processing tool are provided for trimming a gate electrode structure containing a gate electrode layer with a first dimension. A reaction layer is formed through reaction with the gate electrode structure. The reaction layer is the selectively removed from the unreacted portion of the gate electrode structure by chemical etching, thereby forming a trimmed gate electrode structure with a second dimension that is smaller than the first dimension. The trimming process can be carried out under process conditions where formation of the reaction layer is substantially self-limiting. The trimming process can be repeated to further reduce the dimension of the gate electrode structure.

34 Claims, 10 Drawing Sheets

METHOD OF TRIMMING A GATE ELECTRODE STRUCTURE

FIELD OF THE INVENTION

The present invention relates to semiconductor manufacturing, particularly to a method of reducing a dimension of a gate electrode structure using a chemical trimming process.

BACKGROUND OF THE INVENTION

Plasma processing systems are used in the manufacture and processing of semiconductors, integrated circuits, displays, and other devices or materials. Plasma processing can be used to transfer a pattern of an integrated circuit from a lithographic mask to a semiconductor substrate. The lithographic mask can comprise an etch-resistant photoresist layer that is deposited over a substrate, exposed to a selected lithographic pattern and developed. In addition to the photoresist layer, the lithographic mask structure can include additional mask layers, e.g., anti-reflective coatings (ARCs). ARC layers are frequently used to reduce light reflections from the substrate during lithography steps, and sacrificial masks can be used to pattern areas on a substrate. The substrate is then anisotropically etched in a plasma process where the patterned photoresist/mask layers define openings in the substrate.

The minimum feature sizes of microelectronic devices are approaching the deep sub-micron regime to meet the demand for faster, lower power microprocessors and digital circuits. A critical dimension (CD) of a circuit is the width of a line or space that has been identified as critical to the device being fabricated to operate properly and it further determines the device performance.

The minimum initial feature size that can be achieved using a layer of photoresist material is limited by the lithographic techniques used to expose and pattern the photoresist layer. Commonly, a dimension of a patterned photoresist (PR) layer is trimmed beyond the limits of the lithographic technique utilizing plasma etching methods. The reduction in CD during the plasma etching process is referred to as CD-bias. However, a consequence of plasma PR-trim process is iso-dense CD-bias, which is the difference between the CDs of dense (closely spaced) and isolated structures, while keeping all other processing parameters (e.g., focus and exposure) constant. This is due to the nature of the neutral-dominant isotropic etching process.

SUMMARY OF THE INVENTION

The present invention provides a method of trimming a gate electrode structure by providing a gate electrode structure having a first dimension, selecting a trimming recipe, forming a reaction layer through reaction with the gate electrode structure, removing the reaction layer from the unreacted portion of the gate electrode structure by chemical etching, thereby forming a gate electrode layer having a second dimension that is smaller than the first dimension.

A processing tool is provided for trimming a gate electrode structure. The processing tool contains a substrate loading chamber configured for loading and unloading a substrate with a gate electrode structure having a first dimension, a transfer system configured for transferring the substrate within the processing tool, at least one processing system configured for forming a reaction layer through reaction with the gate electrode structure and selectively removing the reaction layer from the unreacted portion of the gate electrode structure in by chemical etching, and a controller configured for controlling the processing tool according to a trimming recipe to form a gate electrode structure having a second dimension that is smaller than the first dimension.

DETAILED DESCRIPTION OF SEVERAL EMBODIMENTS

FIGS. 1A–1G show a schematic cross-sectional representation of a process flow for trimming a gate electrode structure according to an embodiment of the invention. Utilizing a soft-mask processing scheme, a dimension of a lithographically patterned gate electrode structure is trimmed by a chemical etching process. The dimension after trimming can be below the lithographic dimension of the photoresist pattern, or it can be any dimension.

Figure 1A:
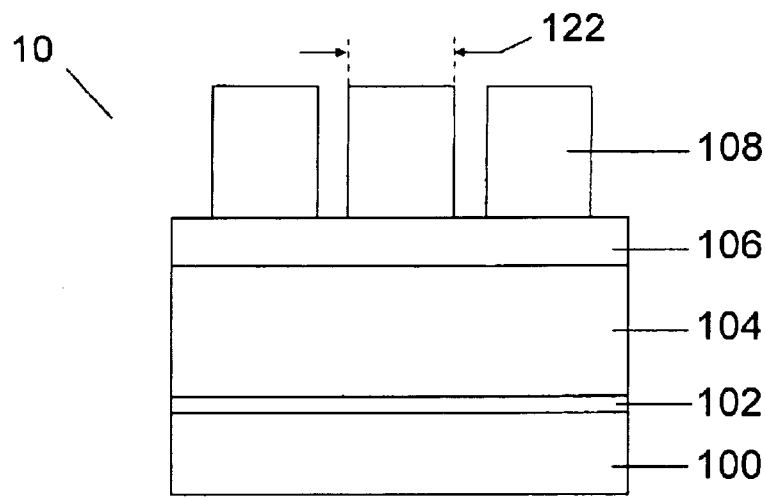
FIGS. 1A–1G show a schematic cross-sectional representation of a process flow for trimming a gate electrode structure according to an embodiment of the invention.
Figure 1B:
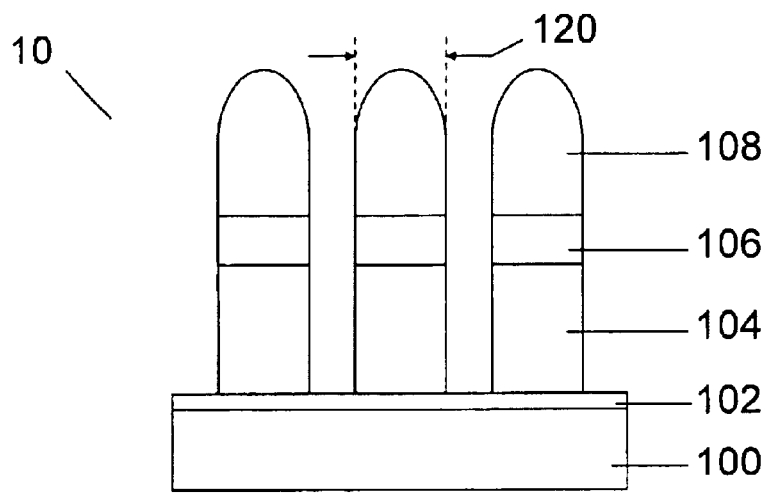

FIG. 1A shows a gate electrode structure 10 containing a substrate 100, a high-k layer 102, a gate electrode layer 104, an organic ARC layer 106, and a patterned photoresist layer 108. The gate electrode layer 104 can be a Si-containing layer, e.g., amorphous Si, poly-Si, or SiGe. Alternately, the gate electrode layer 104 can be a metal-containing layer, for example a metal (e.g., Ru), a metal alloy (e.g., TiNi), a metal nitride (e.g., TaN, TaSiN, TiN, HfN), or a metal oxide (e.g., $RuO_2$). The high-k layer 102 can, for example, contain at least one of $HfO_2$, $HfSiO_x$, $ZrO_2$, and $ZrSiO_x$. The patterned photoresist layer 108 can be formed by exposing a photoresist layer to light through a mask, and then removing the unexposed areas with a developer solution. The resulting patterned photoresist layer 108 in FIG. 1A, with an initial lithographic dimension 122, can be used to transfer the lithographic pattern to the underlying layers 104 and 106 using an anisotropic etch process such as Reactive Ion Etching (RIE). The etching of the gate electrode layer 104 and the organic ARC layer 106 can be carried out using wide variety of well-known etch gases. The etch gases can, for example, contain at least one of $Cl_2$, HBr, HCl, $CF_4$, $SF_6$, $C_2F_6$, and $NF_3$. The gate electrode structure 10, shown in FIG. 1A, can require an etch process of about 4 min to form the gate electrode structure 10 shown in FIG. 1B. The etch process creates a small CD-bias corresponding to the difference between the initial lithographic dimension 122 and the first horizontal dimension 120 in the photoresist layer 108, the organic ARC layer 106, and the gate electrode layer 104, as shown in FIG. 1B.

Figure 1C:
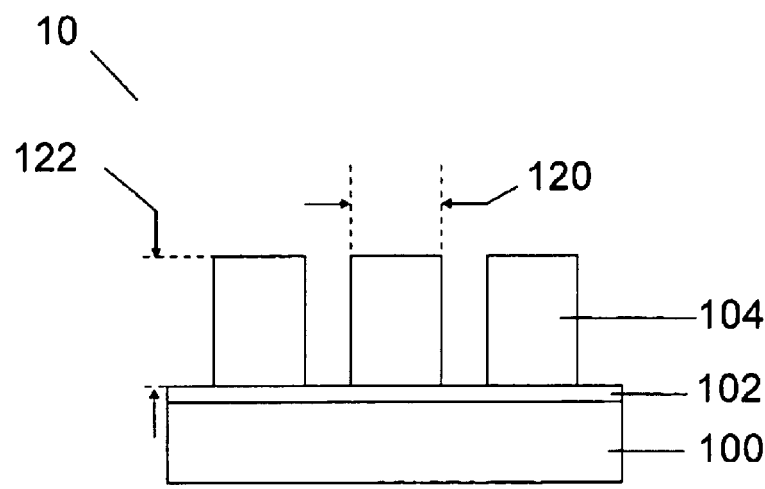

Next, the photoresist layer 108 and the organic ARC layer 106 can be removed before the chemical trimming process is carried out, as shown in FIG. 1C, or alternately, the photoresist layer 108 and the organic ARC layer 106 can be used to protect the horizontal (top) surface of the gate electrode layer 104 during the trimming process. In FIG. 1C, the gate electrode layer 104 is characterized by the first horizontal dimension 120 and a first vertical dimension 122. A chemical trimming process can further reduce the CD (first horizontal dimension 118, see FIG. 1D) below the lithographical dimension 120, without changing the iso-dense CD-bias or the profile (maybe a little change on profile) of the gate electrode layer 104.

Figure 1D:
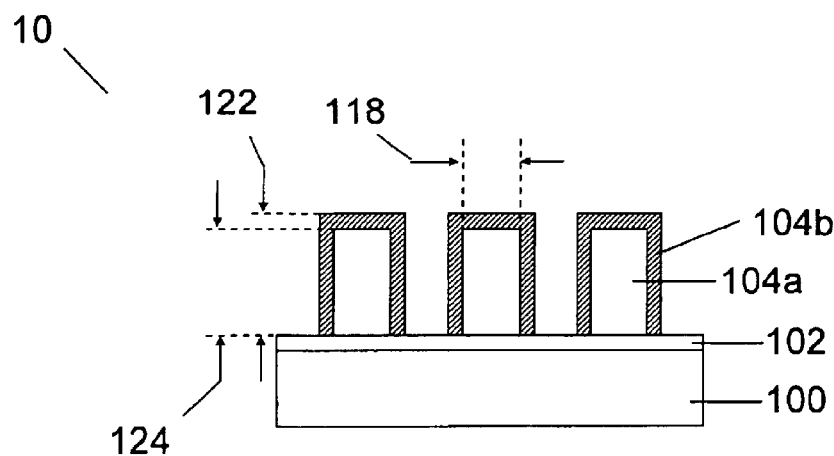

In the chemical trimming process, the gate electrode structure 10 in FIG. 1C can be exposed to a reactant gas that reacts isotropically with the gate electrode structure 10 to form the reaction layer 104b shown in FIG. 1D. The reactant gas can be exposed to the gate electrode structure in a thermal process or in a plasma process. The thickness of the reaction layer 104b depends on the process conditions, e.g., the type of reactant gas, reactant gas pressure, exposure time, and substrate temperature. Formation of the reaction layer 104b hinders further reaction between the remaining gate electrode layer 104a and the reactant gas by acting as a physical diffusion barrier. The gate electrode structure 10 is exposed to the reactant gas for a time period that enables formation of a reaction layer 104b with a desired thickness.

Figure 2:
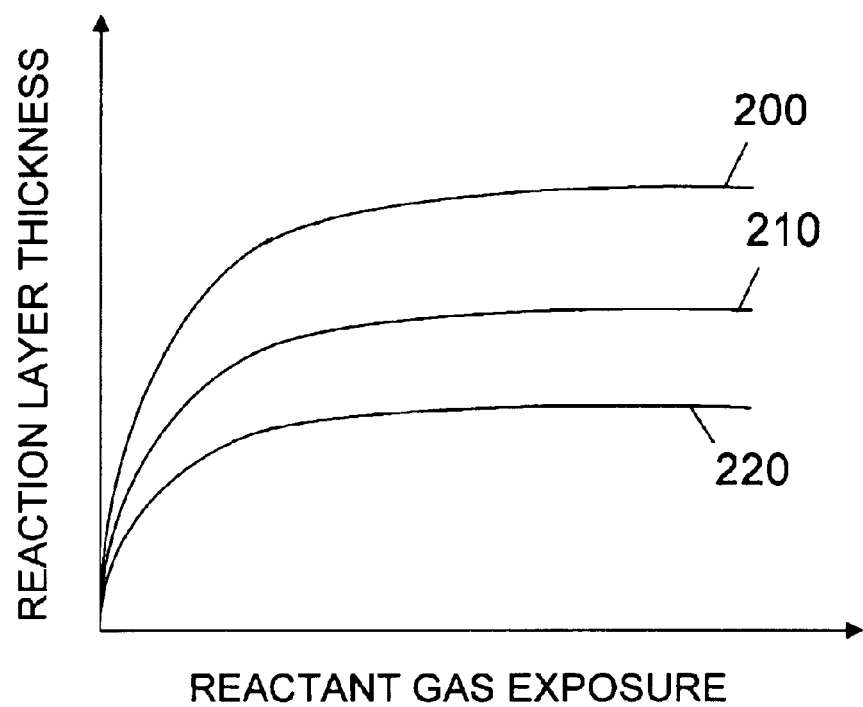
FIG. 2 schematically shows reaction layer thickness as a function of reactant gas exposure according to an embodiment of the invention.

FIG. 2 schematically shows reaction layer thickness as a function of reactant gas exposure time according to an embodiment of the invention. Curves 200–220 show different reaction layer thicknesses for different processing conditions. As seen in FIG. 2, a rapid increase in reaction layer thickness can be initially observed, followed by a "flattening out" of the rate of increase with increasing exposure time. The "flattening out" is due to a self-limiting reaction, where the thickness of the reaction layer approaches an asymptotic value. In practice, process conditions are selected that form a reaction layer with the required control and repeatability, on a timescale that is practical for semiconductor manufacturing. Different trimming recipes can thus be developed that yield different reaction layer thicknesses and allow good repeatable control over the trimming process.

For a poly-Si gate electrode layer 104, a $SiO_2$ reaction layer 104b with a thickness between about 2 nm to about 5 nm can be formed on a time scale that is practical for manufacturing semiconductor devices, e.g., between about 10 and about 30 sec, depending on the plasma processing conditions and the substrate temperature. In one embodiment of the invention, a reactant gas containing excited oxygen species is used to react with a poly-Si gate electrode layer to form a $SiO_2$ reaction layer 104b. The excited oxygen species can be produced using an $O_2$ plasma source. The $O_2$ plasma source can be a remote plasma source if the source needs to be removed from the substrate in the processing system.

In another embodiment of the invention, an oxygen-containing gas such as $O_2$ or $H_2O$, may be used to thermally oxidize a poly-Si gate electrode to form a $SiO_2$ reaction layer. In yet another embodiment of the invention, a wet oxidation process may be used. The oxidizing process may, for example, immerse the substrate in warm $H_2O$ or an acidic solution.

In one example, the $O_2$ plasma processing conditions and the substrate temperature were selected to yield a 4 nm thick $SiO_2$ reaction layer 104b in about 15 sec, on both isolated and dense gate electrode structures. The thickness of the $SiO_2$ reaction layer 104 appeared to be saturated at room temperature after about 15 sec, and longer exposure times did not result in increased thickness of the reaction layer 104b. The short processing times for forming a $SiO_2$ reaction layer 104b allows for the required high substrate through-put.

Referring back to FIG. 1D, when a reaction layer 104b with a desired thickness has been formed, the exposure of the gate electrode structure 10 to the reactant gas is stopped. Thereafter, the reaction layer 104b is removed (stripped) from the unreacted gate electrode layer 104a. The reaction layer 104b can, for example, be removed by exposing the gate electrode structure 10 to an etch gas. Choosing an etch gas that is capable of removing the reaction layer 104b can depend on the gate electrode material. Removal of the reaction layer 104b is selective to unreacted gate electrode material and results in a trimmed gate electrode layer 104a shown in FIG. 1E. The etch gas can, for example be aqueous HF vapor ($HF_{(aq)}$). As those skilled in the art will appreciate, $HF_{(aq)}$ has high etch selectivity for $SiO_2$ over Si, allowing fast, selective removal of the $SiO_2$ reaction layer 104b from the remaining Si gate electrode layer 104a. The exposure of the $SiO_2$ reaction layer 104b to the $HF_{(aq)}$ etch gas can be carried out for a predetermined time period that is sufficiently long to complete the removal of the $SiO_2$ reaction layer 104b. In one example of the invention, a 4 nm thick $SiO_2$ reaction layer 104b can be removed in about 10 sec. The trimmed gate electrode layer 104a is characterized by a second horizontal dimension 118 and a second vertical dimension 124 that are smaller than the first horizontal dimension 120 and the first vertical dimension 122 in FIG. 1C, respectively. The trimming process can be repeated if it is desired to further trim the gate electrode layer 104a. Repeating the trimming process forms a reaction layer 104d in FIG. 1F, and a trimmed gate electrode layer 104c with new dimensions 116 and 126 in FIG. 1G. Another example to trim away oxidized film 104a is to use COR (chemical oxide removal). Etch gases HF and $NH_3$ are used to react with the oxide film and then heat treatment is used to evaporate the trimmed product. Another COR example is to use $NF_3$ and $NH_3$ etch gases excited by a remote plasma source. Still another COR example is to use $NH_4F$ vapor to thermally react with the oxide film. Another example to trim away oxidized film 104a is to use a wet process. The wet process may, for example, immerse the substrate in a buffered HF solution.

Figure 1E:
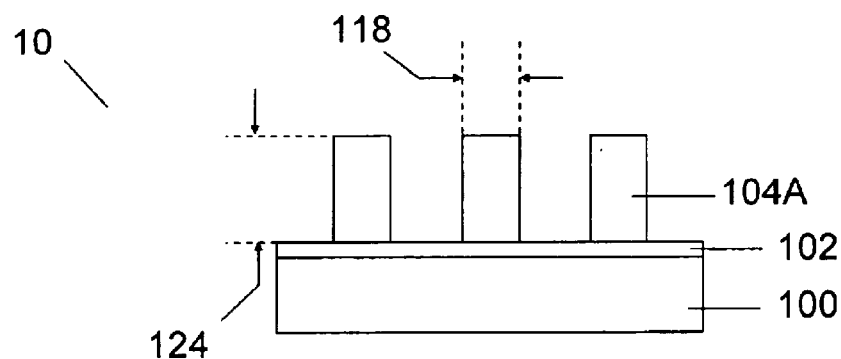
Figure 1F:
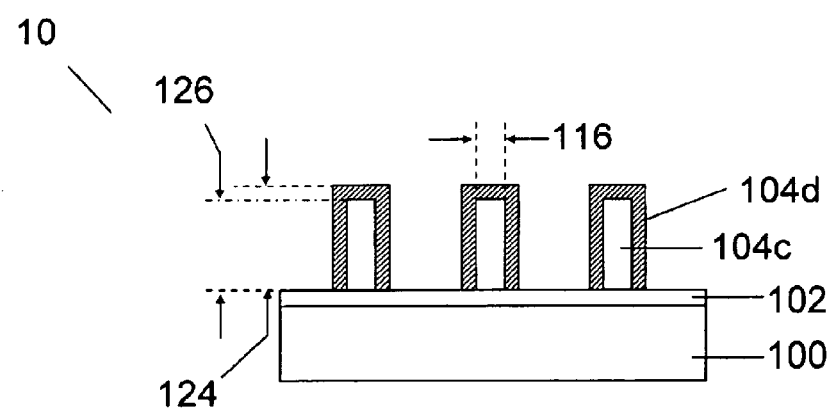
Figure 1G:
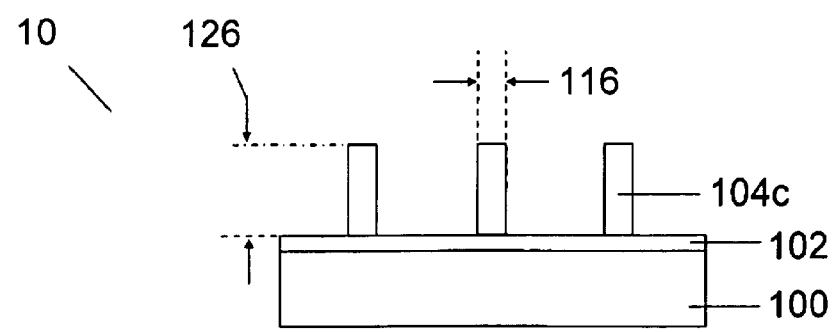

A trimming cycle includes forming a reaction layer and removing the reaction layer. In FIG. 1C-1E, a trimming cycle reduces the first horizontal dimension 120 of the gate electrode layer 104 twice as much as the first vertical dimension 122. In one embodiment of the invention, one trimming cycle can reduce the horizontal dimension 120 of a Si gate electrode layer 104 by about 8 nm and vertical dimension by about 4 nm. In one example, the first vertical dimension 120 can be about 120 nm and the first vertical dimension 122 can be about 140 nm. A trimming process containing 10 trimming cycles can reduce the first horizontal dimension 120 to about 40 nm and the first vertical dimension 122 to about 100 nm.

Figure 3A:
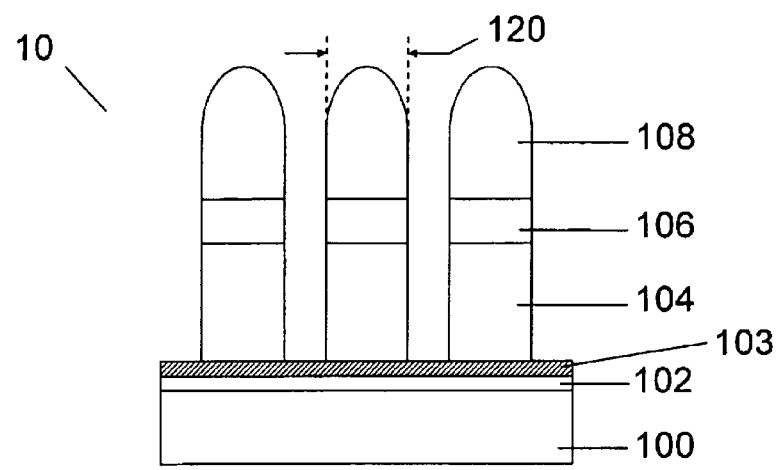
FIGS. 3A–3C show a schematic cross-sectional representation of a process flow for trimming gate electrode structure according to another embodiment of the invention.
Figure 3B:
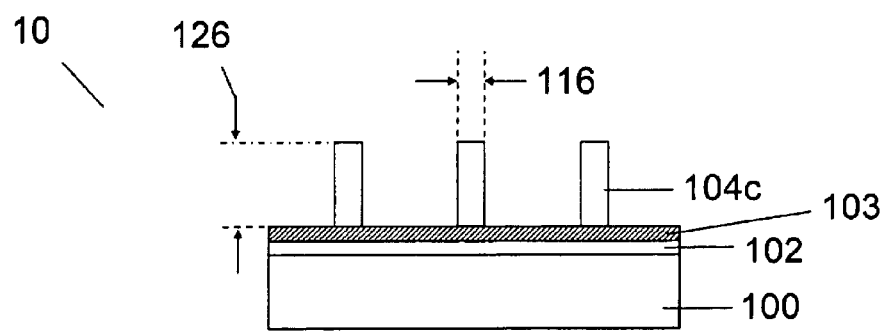
Figure 3C:
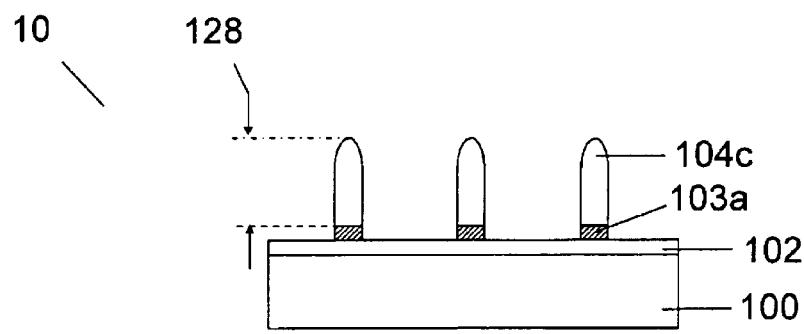

FIGS. 3A–3C show a schematic cross-sectional representation of a process flow for trimming a gate electrode structure according to another embodiment of the invention. In FIG. 3A, a metal-containing layer 103 is inserted between gate electrode layer 104 and the dielectric layer 102. The metal-containing layer 103 can, for example, be selected from TaN, TiN, TaSiN, Ru, and $RuO_2$ materials. The high-k layer 102 can, for example, contain at least one of $HfO_2$, $HfSiO_x$, $ZrO_2$, and $ZrSiO_x$. Trimming of the gate electrode layer 104 can be carried out as described above in FIGS. 1B–1G, to form a gate electrode structure 10 with dimensions 116 and 126, as shown in FIG. 3B. Next, the trimmed gate electrode layer 104c can be used as a mask layer in an anisotropic etch process to define sub-lithographic etch features in the metal-containing layer 103, as shown in FIG. 3C. Etching of the metal-containing layer 103 reduces the dimension 126 of the gate electrode layer 104c according to the etch ratio of these layers. In the example of a poly-Si layer 104c and a TiN layer 103, the etch ratio can be about 1.5 (poly-Si/TiN). Therefore, in order to get the desired vertical dimension 128, the dimension 126 can be selected based on the etch ratio of layers 104 and 103. TaN, TiN, and TaSiN materials can be plasma etched using halogen-based gases, for example $Cl_2$. A Ru-containing material can, for example, be plasma etched using $O_2$ and $Cl_2$ gas mixture. Alternatively, as shown in FIG. 4A-4B, an inorganic ARC layer can be used to prevent reducing the dimension 126 while etching the metal containing layer 103.

Figure 4A:
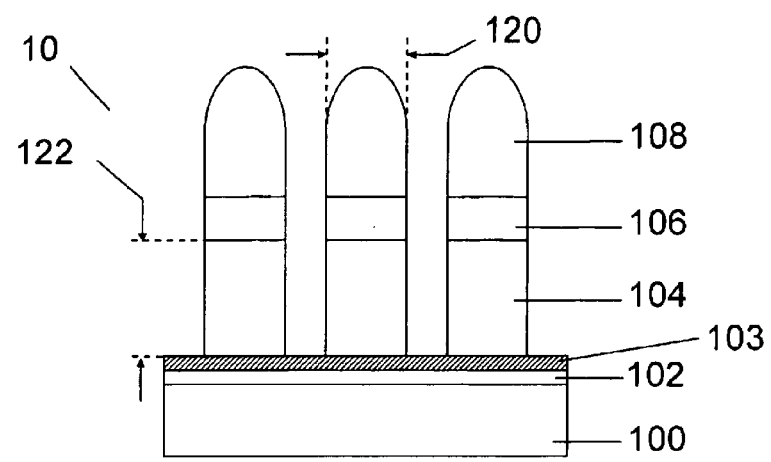
FIGS. 4A–4B show a schematic cross-sectional representation of a process flow for trimming a gate electrode structure according to yet another embodiment of the invention.
Figure 4B:
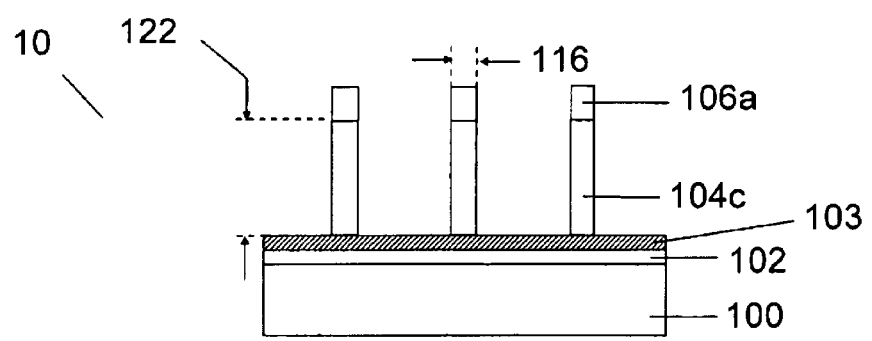

FIGS. 4A–4B show a schematic cross-sectional representation of a process flow for trimming a gate electrode structure according to yet another embodiment of the invention. The gate electrode structure 10 in FIG. 4A contains an inorganic ARC layer 106 that is trimmed along with the gate electrode layer 104 to form a trimmed gate electrode structure 10 in FIG. 4B. The inorganic ARC layer 106 can, for example, contain SiN, and the dielectric layer 102 can be selected from $SiO_2$, $SiO_xN_y$, and high-k materials such as $HfO_2$, $HfSiO_x$, $ZrO_2$, and $ZrSiO_x$.

Trimming of a SiN ARC layer 106 and a poly-Si gate electrode layer 104 can be performed by exposing the gate electrode structure 10 to excited oxygen species in an $O_2$ plasma. The growth rate of a reaction layer can vary on the SiN ARC layer and the poly-Si gate electrode layer, but the asymptotic reaction layer thickness is expected be similar on the SiN and poly-Si materials.

Figure 5A:
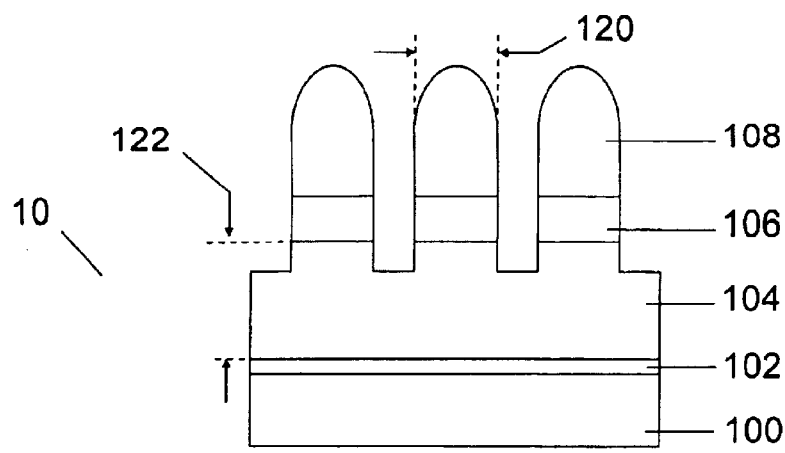
FIGS. 5A–5D show a schematic cross-sectional representation of a process flow for trimming a gate electrode structure according to still another embodiment of the invention.
Figure 5B:
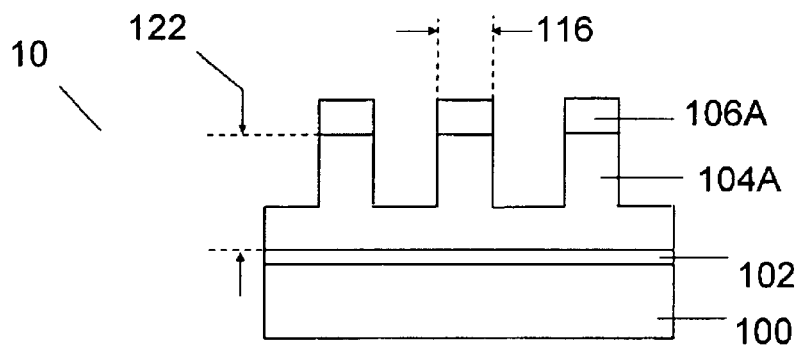
Figure 5C:
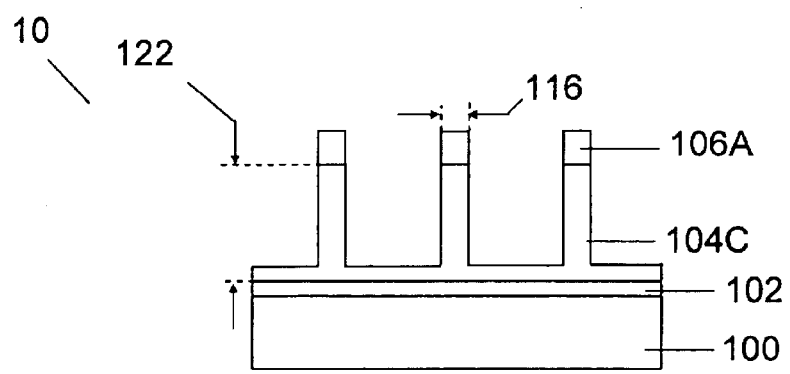
Figure 5D:
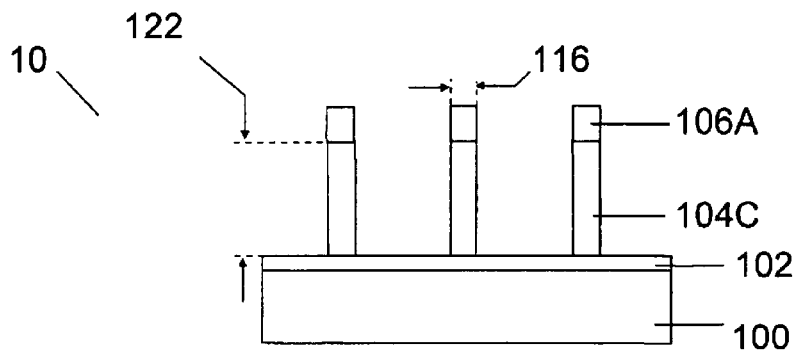

FIGS. 5A–5D show a schematic cross-sectional representation of a process flow for trimming a gate electrode structure according to still another embodiment of the invention. The gate electrode structure 10 contains a substrate 100, a dielectric layer 102, a gate electrode layer 104, an inorganic ARC layer 106, and a patterned photoresist layer 108. The inorganic ARC layer 106 can, for example, contain SiN, and the dielectric layer 102 can be selected from $SiO_2$, $SiO_xN_y$, and high-k materials such as $HfO_2$, $HfSiO_x$, $ZrO_2$, and $ZrSiO_x$. FIG. 5A shows a gate electrode structure following plasma etching of the inorganic ARC layer 106 and partial etching of the gate electrode layer 104. FIG. 5B shows the trimmed gate electrode structure 10 after one trimming cycle and FIG. 5C shows the trimmed gate electrode structure 10 after two trimming cycles. FIG. 5D shows the gate electrode structure 10 following anisotropic etching of the gate electrode layer 104c.

Figure 6:
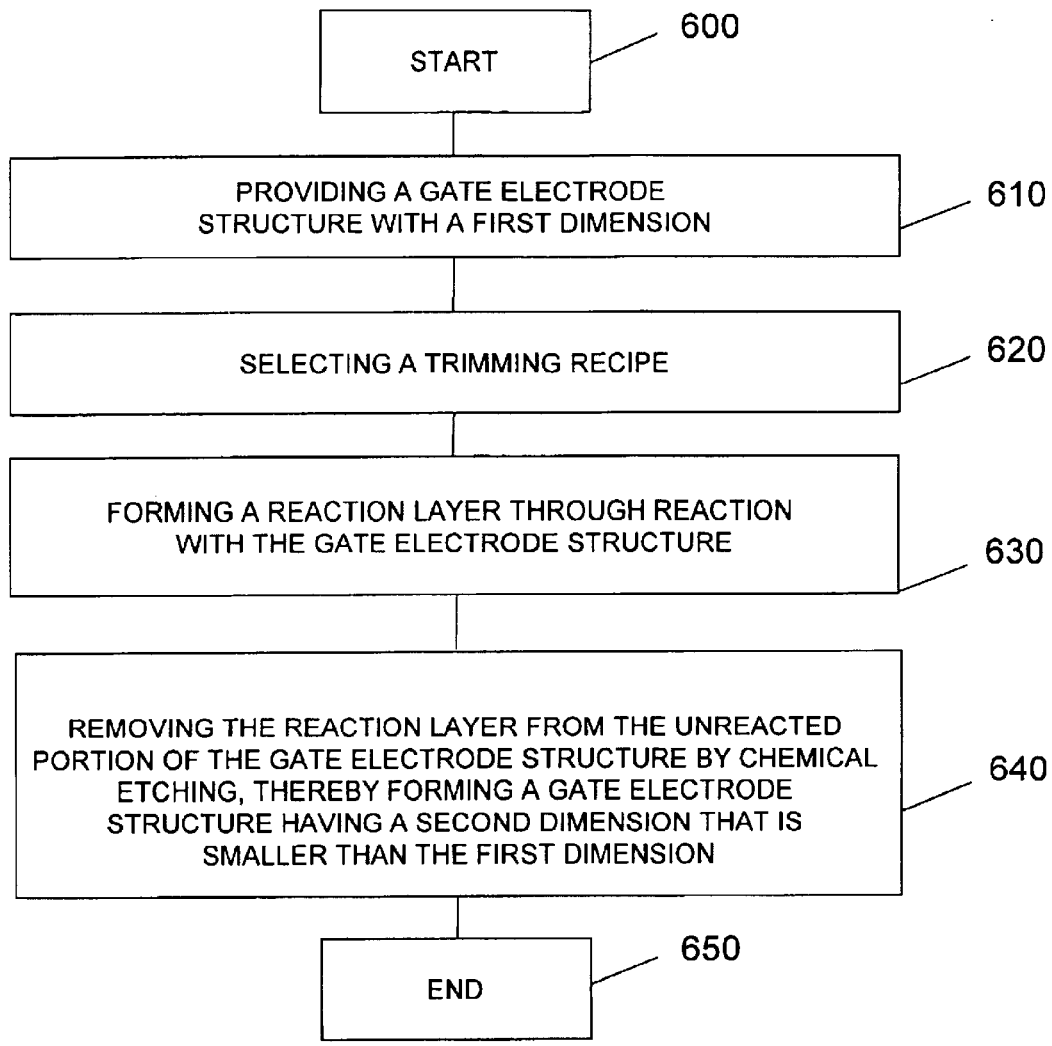
FIG. 6 is a flowchart for trimming a gate electrode structure according to an embodiment of the invention.

FIG. 6 is a flow-chart for trimming a gate electrode structure according to an embodiment of the invention. At 600, the process is started. At 610, a gate electrode structure containing a gate electrode layer with a first dimension is provided in a processing system. At 620, a trimming recipe is selected. A trimming recipe is selected that enables the desired trimming of the gate electrode structure. At 630, a reaction layer is formed through reaction with the gate electrode structure. In one embodiment of the invention, the reaction layer can be formed by exposing the gate electrode structure a reactant gas in a thermal process or in a plasma process. At 640, the reaction layer is removed from the unreacted portion of the gate electrode structure, thereby forming a gate electrode structure having a second dimension-that is smaller than the first dimension. In one embodiment of the invention, the reaction layer can be removed by exposed it to an etch gas capable of selectively etching the reaction layer.

Figure 7:
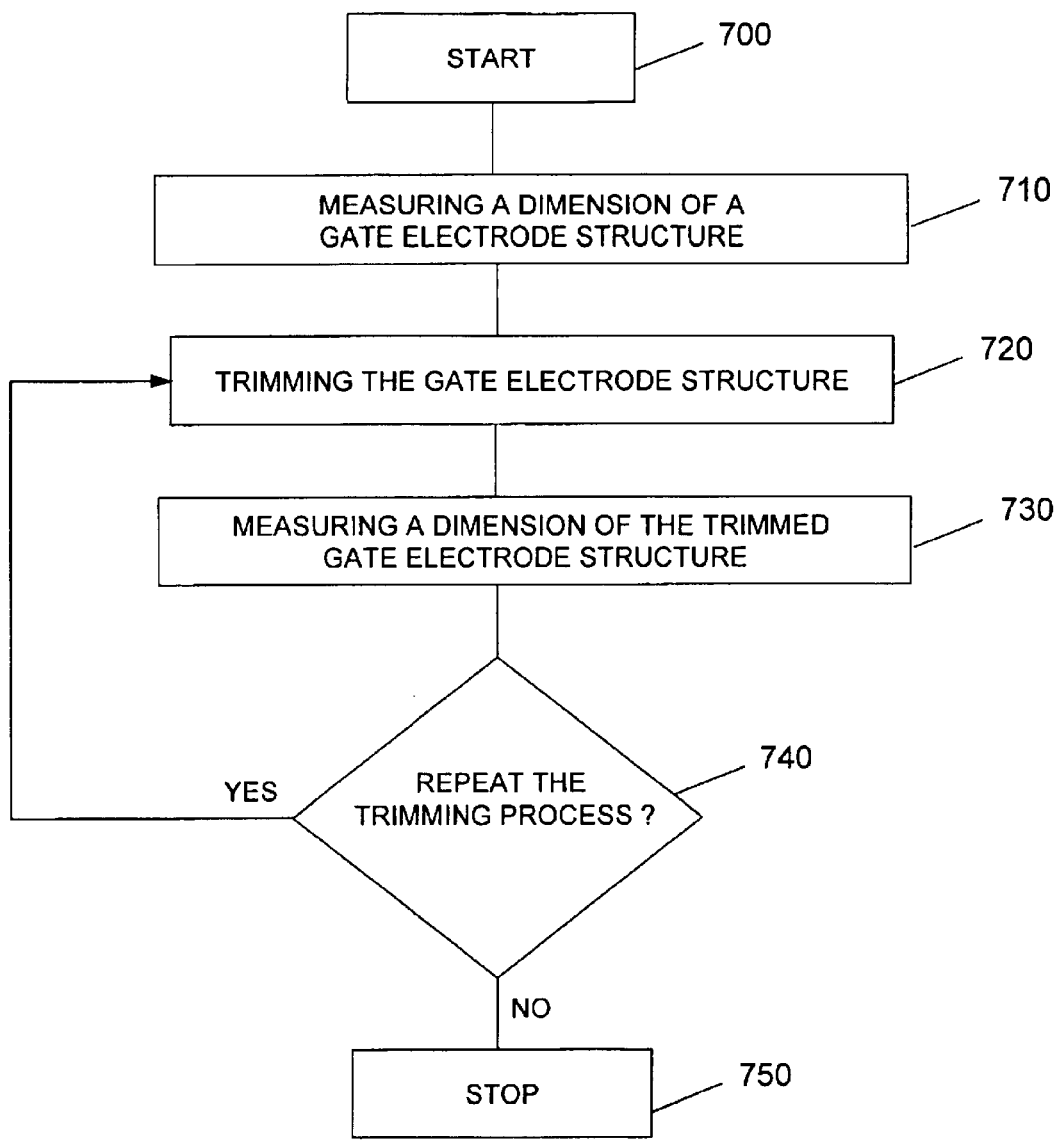
FIG. 7 is flowchart for trimming a gate electrode structure according to an embodiment of the invention.

FIG. 7 is a flow-chart for forming a trimmed electrode structure according to an embodiment of the invention. At 700, the process is started. At 710, a dimension of the gate electrode structure is measured. The dimension can, for example, be non-destructively measured in-situ using scatterometric methods. At 720, the gate electrode layer is trimmed as described in FIG. 6. At 730, a dimension of the trimmed gate electrode structure is measured, and based on the measured dimension at 730, a decision is made at 740 to repeat the trimming process at 720, or to stop the process at 750.

The trimming process can be repeated at 730 using the same or a different trimming recipe than in an previous trimming cycle, in order to further reduce a dimension of the gate electrode structure to a desired value. When the desired dimension has been achieved, the process is stopped in step 760. Alternatively, at least one of the measuring steps 710 and 740 can be omitted from the process flow and the trimming process carried out a pre-determined number of times. The selection of a reactant and etch gases can depend on the type of gate electrode material to be trimmed, amount of trimming that is needed, compatibility of the gases with substrate materials and processing system components, hardware capabilities, and environmental factors.

Figure 8:
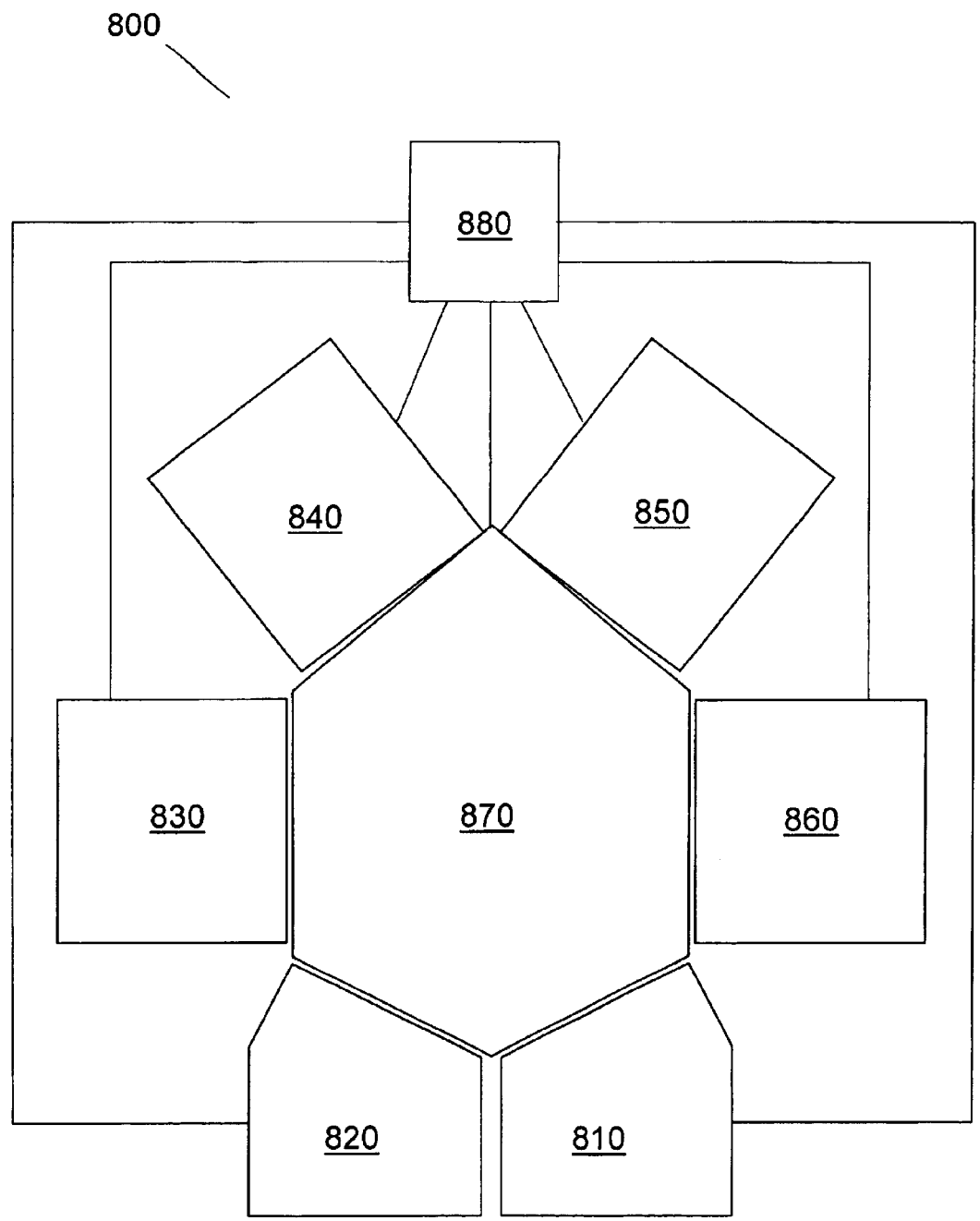
FIG. 8 schematically shows a processing tool for trimming a gate electrode structure according to an embodiment of the invention.

FIG. 8 schematically shows a processing tool for trimming a gate electrode structure according to an embodiment of the invention. The processing tool 800 can, for example, be a UnityMe etch tool from Tokyo Electron Limited, Akasaka, Japan. The processing tool 800 contains substrate loading chambers 810 and 820, processing systems 830–860, robotic transfer system 870, and controller 880. In one embodiment of the invention, plasma etching of a photoresist layer 108, an ARC layer 106, a gate electrode layer 104 (e.g., see FIG. 1), and a metal-containing layer 103 (e.g., see FIG. 3), can be performed in the processing system 840. In one embodiment of the invention, formation of a reaction layer through exposure of a gate electrode structure to a reactant gas can be performed in processing system 850, and the removal of the reaction layer 104b through exposure to an etch gas can be performed in processing system 860.

The formation and removal of the reaction layer 104b can be carried out in a single processing system as described above or, alternately, in different processing systems. The use of multiple processing systems to perform a trimming cycle can be advantageous when the trimming process includes corrosive gaseous reactants that are difficult to evacuate from a processing system following a gas exposure. A high background pressure containing corrosive gaseous reactants, can result in continued reaction with the gate electrode layer and can erode the semiconductor substrate.

In one embodiment of the invention, the processing system 830 can be used as an analysis chamber for determining a dimension of a gate electrode structure. Based on the measured dimension, a decision can be made to perform another trimming cycle, using the same or another trimming recipe, or to stop the trimming process. The processing system 830 can, for example, be an Optical Digital Profilometer (ODP™) from TIMBRE Technologies, Santa Clara, Calif.

The processing tool 800 can be controlled by a controller 880. The controller 880 can be coupled to and exchange information with substrate loading chambers 810 and 820, processing systems 830–860, and robotic transfer system 870. For example, a program stored in the memory of the controller 880 can be utilized to control the aforementioned components of the processing 800 according to a desired process, and to perform any functions associated with monitoring the process. One example of controller 880 is a DELL PRECISION WORKSTATION 610™, available from Dell Corporation, Austin, Tex.

Figure 9:
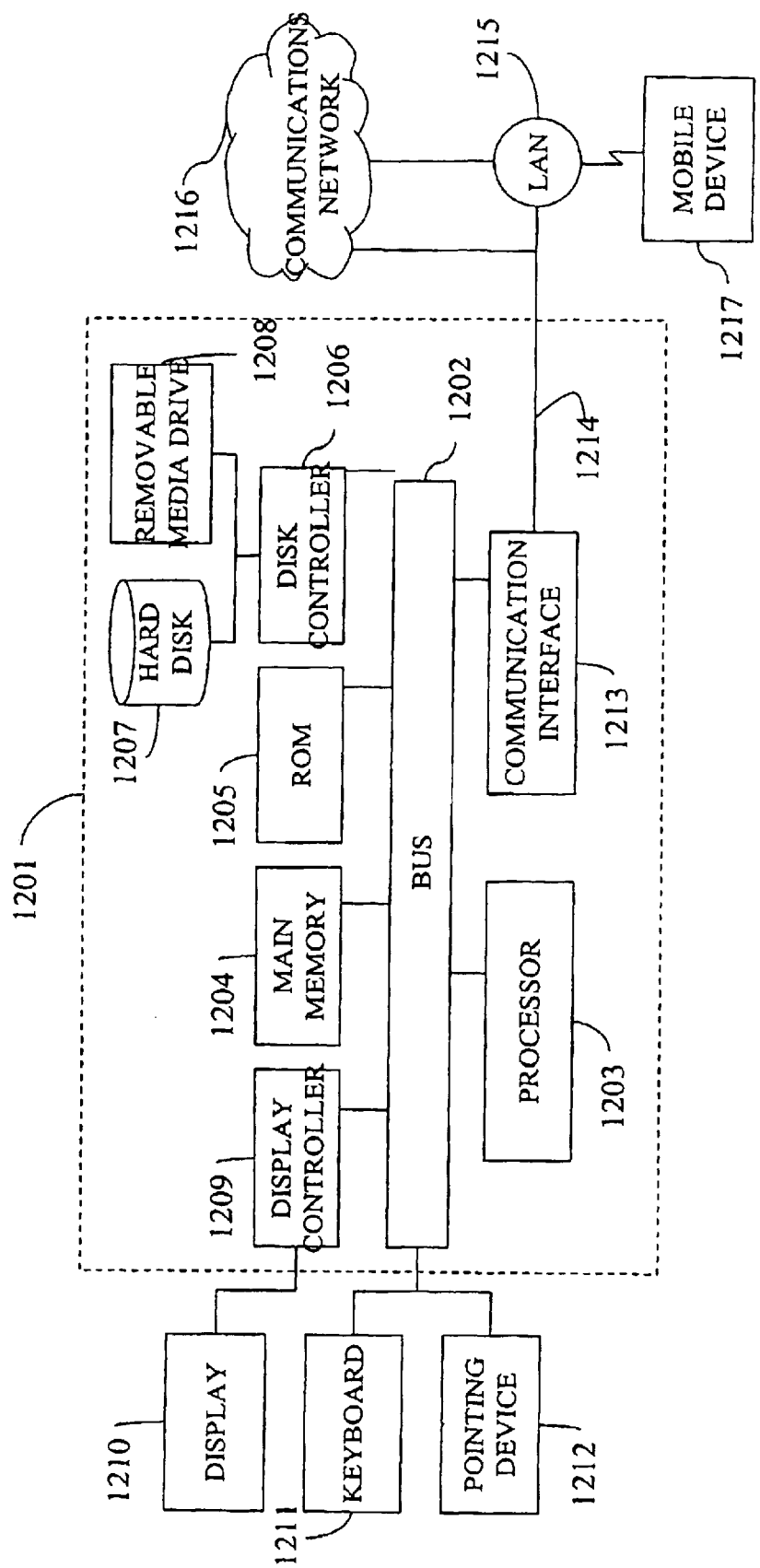
FIG. 9 is a depiction of a general purpose computer which may be used to implement the present invention.

FIG. 9 illustrates a computer system 1201 upon which an embodiment of the present invention may be implemented. The computer system 1201 may be used as the controller of FIG. 8, or a similar controller that may be used to perform any or all of the functions described above. The computer system 1201 includes a bus 1202 or other communication mechanism for communicating information, and a processor 1203 coupled with the bus 1202 for processing the information. The computer system 1201 also includes a main memory 1204, such as a random access memory (RAM) or other dynamic storage device (e.g., dynamic RAM (DRAM), static RAM (SRAM), and synchronous DRAM (SDRAM)), coupled to the bus 1202 for storing information and instructions to be executed by processor 1203. In addition, the main memory 1204 may be used for storing temporary variables or other intermediate information during the execution of instructions by the processor 1203. The computer system 1201 further includes a read only memory (ROM) 1205 or other static storage device (e.g., programmable ROM (PROM), erasable PROM (EPROM), and electrically erasable PROM (EEPROM)) coupled to the bus 1202 for storing static information and instructions for the processor 1203.

The computer system 1201 also includes a disk controller 1206 coupled to the bus 1202 to control one or more storage devices for storing information and instructions, such as a magnetic hard disk 1207, and a removable media drive 1208 (e.g., floppy disk drive, read-only compact disc drive, read/write compact disc drive, compact disc jukebox, tape drive, and removable magneto-optical drive). The storage devices may be added to the computer system 1201 using an appropriate device interface (e.g., small computer system interface (SCSI), integrated device electronics (IDE), enhanced-IDE (E-IDE), direct memory access (DMA), or ultra-DMA).

The computer system 1201 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs)). The computer system may also include one or more digital signal processors (DSPs) such as the TMS320 series of chips from Texas Instruments, the DSP56000, DSP56100, DSP56300, DSP56600, and DSP96000 series of chips from Motorola, the DSP1600 and DSP3200 series from Lucent Technologies or the ADSP2100 and ADSP21000 series from Analog Devices. Other processors especially designed to process analog signals that have been converted to the digital domain may also be used. The computer system may also include one or more digital signal processors (DSPs) such as the TMS320 series of chips from Texas Instruments, the DSP56000, DSP56100, DSP56300, DSP56600, and DSP96000 series of chips from Motorola, the DSP1600 and DSP3200 series from Lucent Technologies or the ADSP2100 and ADSP21000 series from Analog Devices. Other processors specially designed to process analog signals that have been converted to the digital domain may also be used.

The computer system 1201 may also include a display controller 1209 coupled to the bus 1202 to control a display 1210, such as a cathode ray tube (CRT), for displaying information to a computer user. The computer system includes input devices, such as a keyboard 1211 and a pointing device 1212, for interacting with a computer user and providing information to the processor 1203. The pointing device 1212, for example, may be a mouse, a trackball, or a pointing stick for communicating direction information and command selections to the processor 1203 and for controlling cursor movement on the display 1210. In addition, a printer may provide printed listings of data stored and/or generated by the computer system 1201.

The computer system 1201 performs a portion or all of the processing steps of the invention in response to the processor 1203 executing one or more sequences of one or more instructions contained in a memory, such as the main memory 1204. Such instructions may be read into the main memory 1204 from another computer readable medium, such as a hard disk 1207 or a removable media drive 1208. One or more processors in a multi-processing arrangement may also be employed to execute the sequences of instructions contained in main memory 1204. In alternative embodiments, hard-wired circuitry may be used in place of or in combination with software instructions. Thus, embodiments are not limited to any specific combination of hardware circuitry and software.

As stated above, the computer system 1201 includes at least one computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the computer system 1201, for driving a device or devices for implementing the invention, and for enabling the computer system 1201 to interact with a human user (e.g., print production personnel). Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor 1203 for execution. A computer readable medium may take many forms, including but not limited to, non-volatile media, volatile media, and transmission media. Non-volatile media includes, for example, optical, magnetic disks, and magneto-optical disks, such as the hard disk 1207 or the removable media drive 1208. Volatile media includes dynamic memory, such as the main memory 1204. Transmission media includes coaxial cables, copper wire and fiber optics, including the wires that make up the bus 1202. Transmission media also may also take the form of acoustic or light waves, such as those generated during radio wave and infrared data communications.

Various forms of computer readable media may be involved in carrying out one or more sequences of one or more instructions to processor 1203 for execution. For example, the instructions may initially be carried on a magnetic disk of a remote computer. The remote computer can load the instructions for implementing all or a portion of the present invention remotely into a dynamic memory and send the instructions over a telephone line using a modem. A modem local to the computer system 1201 may receive the data on the telephone line and use an infrared transmitter to convert the data to an infrared signal. An infrared detector coupled to the bus 1202 can receive the data carried in the infrared signal and place the data on the bus 1202. The bus 1202 carries the data to the main memory 1204, from which the processor 1203 retrieves and executes the instructions. The instructions received by the main memory 1204 may optionally be stored on storage device 1207 or 1208 either before or after execution by processor 1203.

The computer system 1201 also includes a communication interface 1213 coupled to the bus 1202. The communication interface 1213 provides a two-way data communication coupling to a network link 1214 that is connected to, for example, a local area network (LAN) 1215, or to another communications network 1216 such as the Internet. For example, the communication interface 1213 may be a network interface card to attach to any packet switched LAN. As another example, the communication interface 1213 may be an asymmetrical digital subscriber line (ADSL) card, an integrated services digital network (ISDN) card or a modem to provide a data communication connection to a corresponding type of communications line. Wireless links may also be implemented. In any such implementation, the communication interface 1213 sends and receives electrical, electromagnetic or optical signals that carry digital data streams representing various types of information.

The network link 1214 typically provides data communication through one or more networks to other data devices. For example, the network link 1214 may provide a connection to another computer through a local network 1215 (e.g., a LAN) or through equipment operated by a service provider, which provides communication services through a communications network 1216. The local network 1214 and the communications network 1216 use, for example, electrical, electromagnetic, or optical signals that carry digital data streams, and the associated physical layer (e.g., CAT 5 cable, coaxial cable, optical fiber, etc). The signals through the various networks and the signals on the network link 1214 and through the communication interface 1213, which carry the digital data to and from the computer system 1201 maybe implemented in baseband signals, or carrier wave based signals. The baseband signals convey the digital data as unmodulated electrical pulses that are descriptive of a stream of digital data bits, where the term "bits" is to be construed broadly to mean symbol, where each symbol conveys at least one or more information bits. The digital data may also be used to modulate a carrier wave, such as with amplitude, phase and/or frequency shift keyed signals that are propagated over a conductive media, or transmitted as electromagnetic waves through a propagation medium. Thus, the digital data may be sent as unmodulated baseband data through a "wired" communication channel and/or sent within a predetermined frequency band, different than baseband, by modulating a carrier wave. The computer system 1201 can transmit and receive data, including program code, through the network(s) 1215 and 1216, the network link 1214, and the communication interface 1213. Moreover, the network link 1214 may provide a connection through a LAN 1215 to a mobile device 1217 such as a personal digital assistant (PDA) laptop computer, or cellular telephone.

It should be understood that various modifications and variations of the present invention may be employed in practicing the invention. It is therefore to be understood that, within the scope of the appended claims, the invention may be practiced otherwise than as specifically described herein.

What is claimed is:

1. A method of trimming a gate electrode structure, the method comprising:

providing a gate electrode structure having a first dimension;

selecting a trimming recipe;

forming a reaction layer through reaction with the gate electrode structure; and selectively removing the reaction layer from the unreacted portion of the gate electrode structure by chemical etching, thereby forming a trimmed gate electrode structure having a second dimension that is smaller than the first dimension.

2. The method according to claim 1, wherein the gate electrode structure comprises a gate electrode layer.

3. The method according to claim 2, wherein the gate electrode layer comprises at least one of a Si-containing layer and a metal-containing layer.

4. The method according to claim 3, wherein the gate electrode layer includes the Si-containing layer comprising amorphous Si, poly-Si, or SiGe.

5. The method according to claim 3, wherein the gate electrode layer includes the metal-containing layer comprising at least one of a metal, a metal nitride, or a metal oxide.

6. The method according to claim 3, wherein the gate electrode layer includes the metal-containing layer comprising at least one of TaN, TiN, TaSiN, Ru, and $RuO_2$.

7. The method according to claim 2, wherein the gate electrode structure further comprises an ARC layer.

8. The method according to claim 7, wherein the ARC layer comprises an organic ARC layer or an inorganic ARC layer.

9. The method according to claim 7, wherein the ARC layer comprises SiN.

10. The method according to claim 1, wherein the forming comprises exposing the gate electrode structure to a reactant gas in a thermal process or in a plasma process.

11. The method according to claim 1, wherein the reaction layer is formed in a self-limiting process.

12. The method according to claim 10, wherein the reactant gas comprises an excited oxygen-containing gas.

13. The method according to claim 1, wherein the forming comprises exposing the gate electrode structure to a wet oxidation process.

14. The method according to claim 1, wherein the removing comprises exposing the gate electrode structure to an etch gas.

15. The method according to claim 1, wherein the removing comprises exposing the gate electrode structure to $HF_{(aq)}$.

16. The method according to claim 1, wherein the removing comprises exposing the gate electrode structure to HF and $NH_3$ gases and then to a heat treatment.

17. The method according to claim 1, wherein the removing comprises exposing the gate electrode structure to $NF_3$ and $NH_3$ gases in a remote plasma and then to a heat treatment.

18. The method according to claim 1, wherein the removing comprises exposing the gate electrode structure to a wet process.

19. The method according to claim 1, wherein the exposing and removing are carried out in a single processing system.

20. The method according to claim 1, wherein the forming and removing are carried out in multiple processing systems.

21. The method according to claim 1, wherein the first dimension is a lithographic dimension.

22. The method according to claim 1, further comprising measuring at least one of the first and second dimensions of the gate electrode structure.

23. The method according to claim 1, further comprising repeating the selecting, forming, and selectively removing at least once.

24. The method according to claim 1, further comprising using the trimmed gate electrode layer as a mask layer for anisotropic etching.

25. The method according to claim 1, wherein the forming includes forming an oxide layer on a surface of the gate electrode.

26. A computer readable medium containing program instructions for execution on a processor, which when executed by the processor, cause a processing tool to perform the steps of claim 1.

27. A semiconductor device, comprising:
a trimmed gate electrode structure formed by the method of claim 1.

28. A processing tool, comprising:
a substrate loading chamber configured for loading and unloading a substrate with a gate electrode structure having a first dimension;
a transfer system configured for transferring the substrate within the processing tool;
at least one processing system configured for forming a reaction layer through reaction with the gate electrode structure and selectively removing the reaction layer from the unreacted portion of the gate electrode structure by chemical etching; and
a controller configured for controlling the processing tool according to a trimming recipe to form a gate electrode structure having a second dimension that is smaller than the first dimension.

29. The processing tool according to claim 28, wherein the forming comprises exposing the gate electrode structure to a reactant gas in a thermal process or in a plasma process.

30. The processing tool according to claim 28, wherein the removing comprises exposing the gate electrode structure to an etch gas.

31. The processing tool according to claim 28, further comprising a further processing system configured for plasma etching.

32. The processing tool according to claim 31, wherein the further processing system is configured for RIE.

33. The processing tool according to claim 28, wherein the at least one processing system is configured for wet processing.

34. The processing tool according to claim 28, further comprising a processing system configured for measuring at least one of the first and second dimensions of the gate electrode layer.

* * * * *